(12) United States Patent
Uehara

(10) Patent No.: US 10,831,145 B2
(45) Date of Patent: Nov. 10, 2020

(54) POWER SUPPLY INCLUDING RESISTORS

(71) Applicant: CANON KABUSHIKI KAISHA, Tokyo (JP)

(72) Inventor: Takashi Uehara, Kashiwa (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/803,099

(22) Filed: Feb. 27, 2020

(65) Prior Publication Data

US 2020/0301346 A1   Sep. 24, 2020

(30) Foreign Application Priority Data

Mar. 19, 2019   (JP) .................................. 2019-051508

(51) Int. Cl.
| | | |
|---|---|---|
| *G03G 15/00* | (2006.01) | |
| *G03G 15/20* | (2006.01) | |
| *H05K 1/18* | (2006.01) | |
| *G03G 15/02* | (2006.01) | |

(52) U.S. Cl.
CPC ......... *G03G 15/80* (2013.01); *G03G 15/0216* (2013.01); *G03G 15/2039* (2013.01); *G03G 15/5004* (2013.01); *H05K 1/18* (2013.01); *H05K 2201/10015* (2013.01); *H05K 2201/10022* (2013.01)

(58) Field of Classification Search
CPC ............... G03G 15/80; G03G 15/0216; G03G 15/2039; G03G 15/5004; G03G 2201/10022; G03G 2201/10015; H05K 1/18

See application file for complete search history.

(56) References Cited

U.S. PATENT DOCUMENTS

| | | | |
|---|---|---|---|
| 5,132,869 A * | 7/1992 | Nakaya | G03G 15/0258 361/233 |
| 6,690,897 B2 | 2/2004 | Takami | |
| 2015/0016164 A1* | 1/2015 | Takajou | H04N 1/00899 363/84 |

FOREIGN PATENT DOCUMENTS

JP   2002229306 A   8/2002

* cited by examiner

*Primary Examiner* — Hoang X Ngo
(74) *Attorney, Agent, or Firm* — Rossi, Kimms & McDowell LLP

(57) ABSTRACT

A power supply apparatus includes: a detection circuit configured to feed back a voltage to a generation circuit. The detection circuit includes: a first resistor, a second resistor connected in series with the first resistor, a first conductive pattern configured to connect the first resistor and the second resistor in series, a first capacitor connected in parallel to the first resistor, a second capacitor connected in parallel to the second resistor and connected in series with the first capacitor, a second conductive pattern configured to connect the first capacitor and the second capacitor in series, and a third conductive pattern configured to electrically connect the first conductive pattern and the second conductive pattern. A thermal resistance of the third conductive pattern is greater than a thermal resistance of the first conductive pattern.

18 Claims, 7 Drawing Sheets

POWER SUPPLY INCLUDING RESISTORS

BACKGROUND OF THE INVENTION

Field of the Invention

The present invention relates to a power supply including resistors.

Description of the Related Art

In an electrophotographic image forming apparatus, a charging roller is a roller for uniformly charging a photosensitive drum. If the charging roller is left in contact with the photosensitive drum for a long time, the contact portion of the surface of the charging roller may deform. When an image is formed using such a charging roller and a photosensitive drum, density unevenness occurs in a toner image. This phenomenon is called C set (U.S. Pat. No. 6,690,897).

C set is reduced by adding a capacitor to an output unit of a power supply apparatus that generates the charging voltage. Since the charging voltage is a high voltage (e.g., several hundred volts to several thousand volts), a high-voltage proof capacitor is required. Therefore, a capacitor having a lead is employed. However, lead components are expensive compared to chip components. In addition, a chip capacitor having high-voltage tolerance is also expensive. In view of this, it is possible to consider lowering the withstand voltage performance required for each chip capacitor by connecting a plurality of chip capacitors in series. In this case, error (tolerance) in capacitance of each chip capacitor becomes a problem. Specifically, depending on the error of the capacitance of each chip capacitor, variation occurs in the voltage generated across both ends of the chip capacitor. A chip capacitor with a small error with respect to the nominal value of the capacitance is expensive. Further, if the number of chip capacitors connected in series is increased, the influence of the error becomes smaller as a whole, but this also leads to an increase in cost. Therefore, consideration is given for connecting a chip resistor in parallel to each of the chip capacitors, and forming a balance circuit by the chip capacitor and the chip resistor connected in parallel. However, when the heat generated by the chip resistor is propagated to the chip capacitor, the capacitance of the chip capacitor fluctuates. Therefore, it is necessary to design such that the heat generated by the chip resistor is unlikely to be propagated to the chip capacitor.

In addition, when an inexpensive lead component (e.g., a resistor or a capacitor) having a low withstand voltage is used, it is necessary to design similarly to the case where a chip component is used.

SUMMARY OF THE INVENTION

According to an aspect of the present invention, a power supply apparatus includes: a generation circuit configured to generate, in accordance with a predetermined target voltage, a voltage to be supplied to a load; and a detection circuit that is mounted on a printed circuit board and is configured to detect the voltage generated by the generation circuit and feed back the voltage to the generation circuit. The detection circuit includes: a first resistor, a second resistor connected in series with the first resistor, a first conductive pattern configured to connect the first resistor and the second resistor in series, a first capacitor connected in parallel to the first resistor, a second capacitor connected in parallel to the second resistor and connected in series with the first capacitor, a second conductive pattern configured to connect the first capacitor and the second capacitor in series, and a third conductive pattern configured to electrically connect the first conductive pattern and the second conductive pattern. A thermal resistance of the third conductive pattern is greater than a thermal resistance of the first conductive pattern.

Further features of the present invention will become apparent from the following description of exemplary embodiments (with reference to the attached drawings).

DESCRIPTION OF THE EMBODIMENTS

Figure 1:
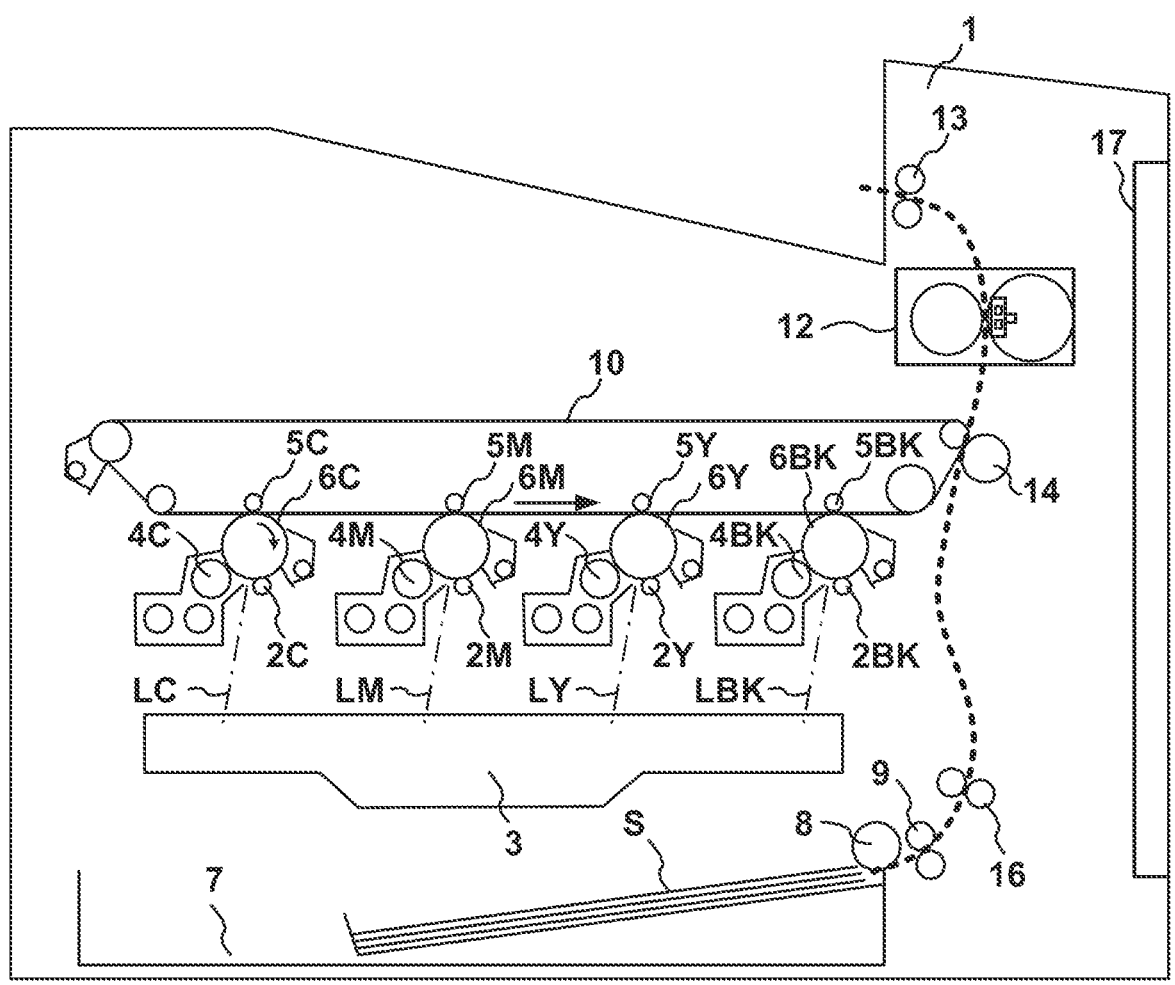
FIG. 1 is a schematic diagram of an image forming apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

<Image Forming Apparatus>

FIG. 1 illustrates an electrophotographic image forming apparatus 1. An image forming apparatus 1 may be an image forming apparatus for forming a monochrome image, but here, it is an electrophotographic image forming apparatus for forming a multicolor image by mixing a plurality of colorants. The image forming apparatus 1 uses four color developers such as yellow (Y), magenta (M), cyan (C), and black (BK). In FIG. 1, a character indicating a color is given to the end of a reference number, but this character is omitted when a matter common to four colors is explained.

Photosensitive drums 6C, 6M, 6Y, and 6BK are image carriers arranged at equal intervals and carrying electrostatic latent images and toner images. A charging roller 2 is an example of a charging unit for uniformly charging the image carrier. The charging roller 2 uniformly charges the surface of the photosensitive drum 6 using a charging voltage. A scanning optical device 3 is an example of an exposure unit that forms an electrostatic latent image by scanning the surface of an image carrier with a laser beam. The scanning optical device 3 emits a light beam (laser beam) L modulated on the basis of the input image toward the photosensitive drum 6. The light beam L forms an electrostatic latent image on the surface of the photosensitive drum 6. A developing device 4 causes cyan, magenta, yellow, and black developer to adhere to the electrostatic latent image through a sleeve or blade to which a developing voltage is applied. As a result, the electrostatic latent image is developed to form a developer image (a toner image).

A feeding roller 8 feeds the sheets S accommodated in the feeding tray 7 one by one. Even if a plurality of sheets S are overlapped, a separation roller 9 separates one sheet S and, by the feeding roller 8, feeds the sheet S to the conveying path. A conveying roller 16 feeds the sheet S toward a secondary transfer portion in synchronization with an image write start timing.

A primary transfer roller 5 transfers the toner image carried on the photosensitive drum 6 to the intermediate transfer belt 10. A primary transfer voltage applied to the primary transfer roller 5 promotes transfer of a toner image to the intermediate transfer belt 10. The intermediate transfer belt 10 functions as an intermediate transfer member. The secondary transfer portion has a secondary transfer roller 14. In the secondary transfer portion, the intermediate transfer belt 10 and the secondary transfer roller 14 convey the sheet S while sandwiching the sheet S, whereby a multi-color toner image carried on the intermediate transfer belt 10 is transferred onto the sheet S. The secondary transfer voltage facilitates transfer of the toner image to the sheet S. Thereafter, the sheet S is conveyed to a fixing device 12. The fixing device 12 applies pressure and heat to the toner image carried on the sheet S to fix the toner image. The discharge roller 13 discharges the sheet S on which the image has been formed. The developing device 4 is an example of a developing unit which develops an electrostatic latent image using a developing voltage to form a toner image. The primary transfer roller 5, the intermediate transfer belt 10, and the secondary transfer roller 14 are examples of a transfer unit that transfers a toner image onto a sheet. The fixing device 12 is an example of a fixing unit that fixes a toner image carried on a sheet. A maintenance door 17 is opened when the image forming apparatus 1 is maintained.

<Power Supply Apparatus>

Figure 2:
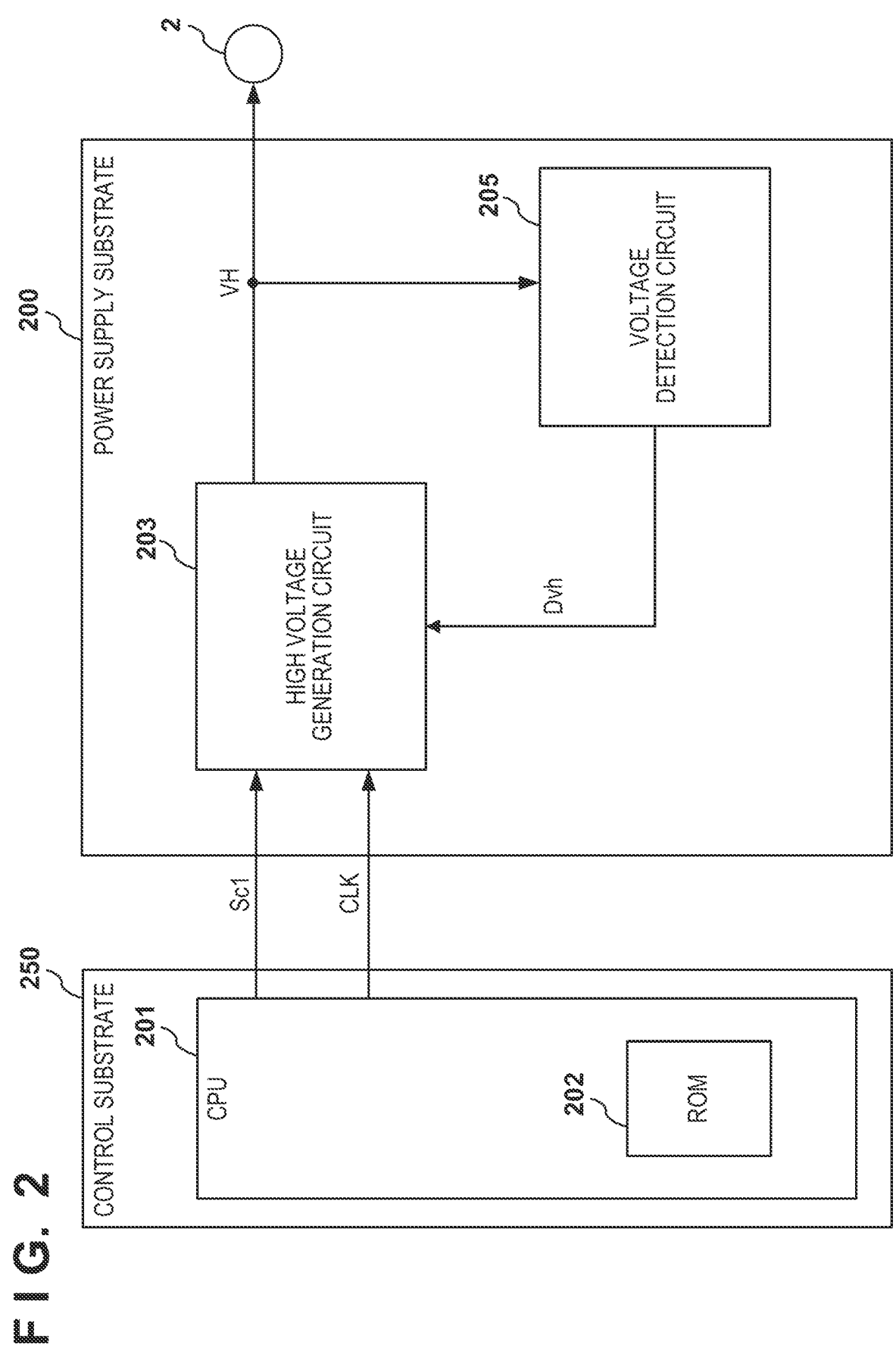
FIG. 2 is a block diagram of a power supply apparatus.

FIG. 2 illustrates a power supply substrate 200 for applying a high voltage to the charging roller 2. One power supply substrate 200 is connected to each charging roller 2Y, 2M, 2C, 2BK. Here, for convenience of description, only one power supply substrate 200 is illustrated. The power supply substrate 200 is an example of a power supply apparatus that generates a charging voltage to be supplied to the charging roller 2.

A control substrate 250 has a CPU 201 and a ROM 202. The CPU 201 is a processor circuit that controls the entire image forming apparatus 1 in accordance with control programs stored in the ROM 202. For example, the CPU 201 generates a setting signal Sc1 and a clock signal CLK for setting the target voltage to the power supply substrate 200, and supplies the clock signal CLK to the power supply substrate 200.

The power supply substrate 200 is a power supply apparatus including a high voltage generation circuit 203 and a voltage detection circuit 205. The high voltage generation circuit 203 generates a high voltage VH, which is to become a target voltage indicated by the setting signal Sc1, and applies the high voltage VH to the charging roller 2. The voltage detection circuit 205 detects an output voltage (high voltage VH) generated by the high voltage generation circuit 203, and feeds back a detection result Dvh to the high voltage generation circuit 203. The high voltage generation circuit 203 performs feedback control based on the detection result Dvh so that the high voltage VH becomes the target voltage.

High Voltage Generation Circuit

Figure 3:
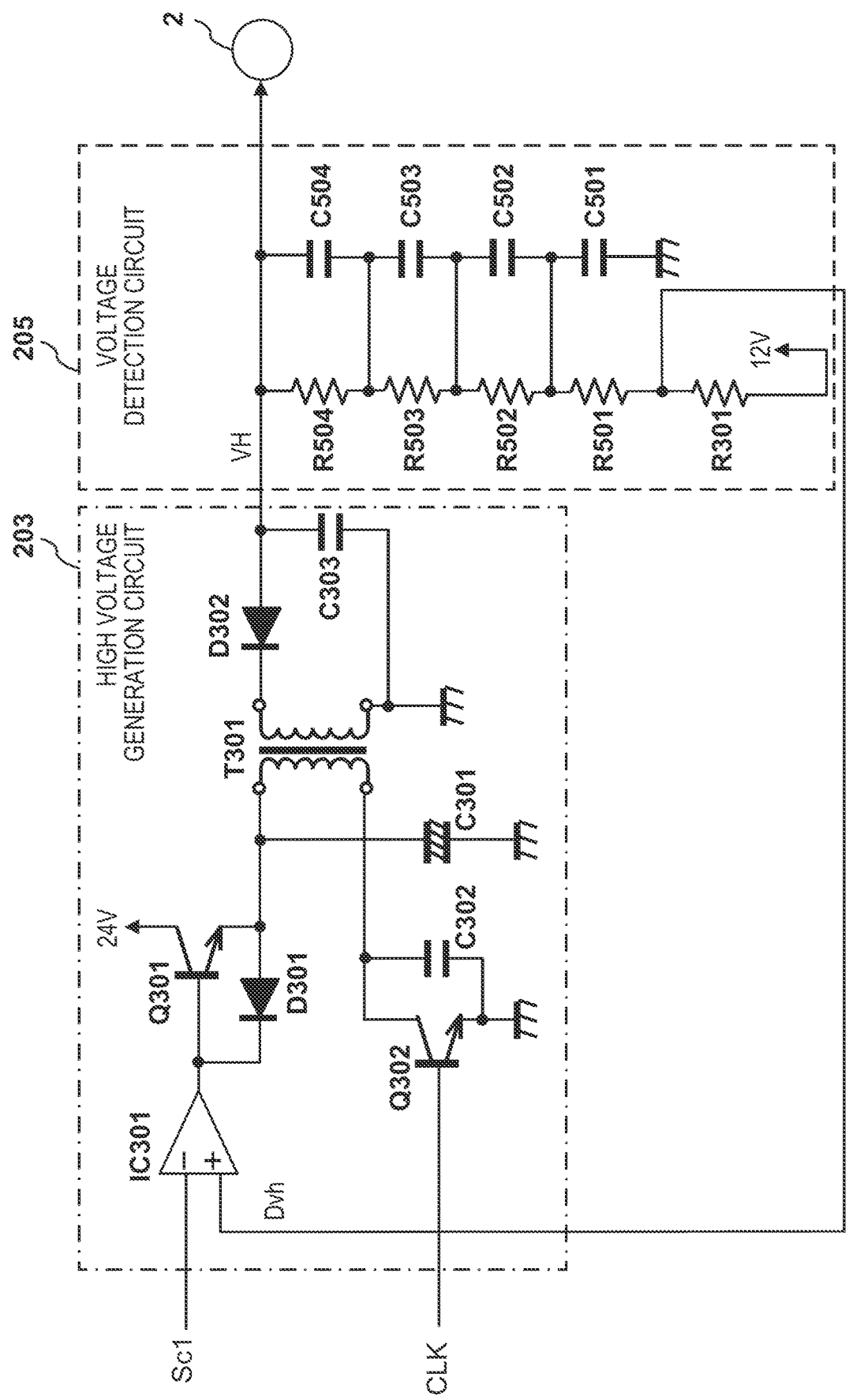
FIG. 3 is a circuit diagram of a generation circuit and a detection circuit.

FIG. 3 is a circuit diagram of the power supply substrate 200. An error amplifier IC 301 adjusts the output voltage of the voltage detection circuit 205 so that the voltage of the setting signal Sc1 inputted from the control substrate 250 matches the output voltage of the voltage detection circuit 205. Therefore, the control substrate 250 can control the high voltage VH outputted from the power supply substrate 200 using the voltage of the setting signal Sc1.

The setting signal Sc1 is inputted to the negative terminal of the error amplifier IC 301. The positive terminal of the error amplifier IC 301 is inputted with the detection result Dvh of the voltage detection circuit 205. The error amplifier IC 301 outputs a voltage so that the voltage level of the setting signal Sc1 matches the voltage level of the detection result Dvh. The output terminal of the error amplifier IC 301 is connected to the base of a transistor Q301. The emitter of the transistor Q301 is connected to the anode of a diode D301. The cathode of the diode D301 is connected to the base of the transistor Q301 and to the output terminal of the error amplifier IC 301. The collector of the transistor Q301 is connected to a 24V power supply. The emitter of the transistor Q301 is connected to one end of the primary winding of a transformer T301. The transistor Q301, the diode D301 and the error amplifier IC 301 form a voltage regulator. The voltage regulator operates to keep the voltage applied to one end of the primary winding of the transformer T301 constant. Note that one end of the primary winding of the transformer T301 is connected to one end of an electrolytic capacitor C301. The other end of the electrolytic capacitor C301 is grounded. The electrolytic capacitor C301 also stabilizes the voltage applied to one end of the primary winding.

A clock signal CLK is inputted to the base of a transistor Q302. The emitter of the transistor Q302 is connected to ground and one end of a capacitor C302. The other end of the capacitor C302 is connected to the collector of the transistor Q302 and to the other end of the primary winding of the transformer T301. That is, the transistor Q302 turns on/off the current flowing in the primary winding by repeatedly turning on/off in response to the clock signal CLK. The capacitor C302 and the primary winding form a kind of resonant circuit. That is, the transistor Q302, the capacitor C302 and the primary winding form a flyback resonant converter.

Note that one end of the secondary winding of the transformer T301 is connected to the cathode of the diode D302. The anode of the diode D302 is connected to the output terminal of the power supply substrate 200. The anode of the diode D302 is connected to one end of a capacitor C303. The other end of the capacitor C303 is connected to ground and to the other end of the secondary winding of the transformer T301. The capacitor C303 is charged through the diode D302 while the transistor Q302 is turned off. That is, the voltage generated in the secondary winding of the transformer T301 is rectified and smoothed by the diode D302 and the capacitor C303, and becomes the direct current high voltage VH. The high voltage VH has a negative polarity.

Voltage Detection Circuit

The voltage detection circuit 205 has a voltage dividing circuit formed of a resistor R301 and resistors R501 to R504. In this example, the high voltage VH is divided according to the ratio of the combined resistance of the resistors R501 to R504 and the resistance of the resistor R301, and the detection result Dvh is generated. The detection result Dvh is a voltage proportional to the high voltage VH and is a voltage of a level that can be applied to the positive terminal of the error amplifier IC 301. Since the high voltage VH has a negative polarity, a +12V power supply is connected to one end of the resistor R301. The other end of the resistor R301 is connected to the positive terminal of the error amplifier IC 301 and to one end of a composite resistor comprising the resistors R501 to R504. The other end of the composite resistor comprising the resistors R501 to R504 is connected to the output terminal of the high voltage generation circuit 203. As a result, the detection result Dvh becomes a positive voltage.

As an example, the resistance of the resistor R301 is set to 120 kΩ. Each resistance of the resistors R501 to R504 is set to 2.5MΩ. Further, the high voltage VH is set to −800V. In this case, the detection result Dvh is 2.37V.

The capacitors C501 to C504 are chip capacitors provided to reduce toner image density unevenness caused by C set. When C set occurs in the charging roller 2, the load generated between the charging roller 2 and the photosensitive drum 6 fluctuates, and the high voltage VH, which is the output voltage, also fluctuates. Therefore, the capacitors C501 to C504 suppress the fluctuation of the output voltage. Note that the capacitor C501 is connected in parallel to the resistor R501 and forms a balance circuit. The capacitor C502 is connected in parallel to the resistor R502 and forms a balance circuit. The capacitor C503 is connected in parallel to the resistor R503 and forms a balance circuit. The capacitor C504 is connected in parallel to the resistor R504 and forms a balance circuit.

The resistors R501 to R504 may be chip resistors. The capacitors C501 to C504 may be chip capacitors. Each resistance of the resistors R501 to R504 may be set to 2.5MΩ. Each withstand voltage of the resistors R501 to R504 may be 500V. Each capacitance of the capacitors C501 to C504 may be 0.015 uF. Each withstand voltage of the capacitors C501 to C504 may be 500V.

The reason why a balance circuit is used is that the capacitance error of the chip capacitor is larger than the resistance error of the chip resistor. Here, it is assumed that the tolerance of the resistors R501 to R504 is ±1%. Here, it is assumed that the tolerance of the capacitors C501 to C504 is ±10%.

In order to explain the advantages of the balance circuit, the case where the balance circuit is not used will be described. Here, it is assumed that the high voltage VH is set to −1800V. Here, it is assumed that the tolerance of the capacitor C501 is −10%. The capacitance of the capacitor C501 is set to 0.0135 uF. Here, it is assumed that the tolerance of the capacitors C502 to C504 is ±10%. Each capacitance of the capacitors C502 to C504 is set to 0.0165 uF. In this case, the voltage applied across both ends of the capacitor C501 is 521V. Voltages applied to both ends of the capacitor C502, both ends of the capacitor C503, and both ends of the capacitor C504 are 426V. In this case, the voltage applied over both ends of the capacitor C501 exceeds the rated value (500V). Therefore, a capacitor having a withstand voltage greater than 500V must be selected as the capacitor C501. Alternatively, it is conceivable to replace the capacitor C501 with a plurality of chip capacitors. However, each of these leads to an increase in manufacturing cost.

On the other hand, by employing a balance circuit, the voltage across both ends of the capacitor is determined to be the voltage of a resistor connected in parallel to the capacitor. That is, the tolerance of the resistor affects the voltage, without the tolerance of the capacitor affecting the voltage. Since the tolerance of the resistor is smaller than the tolerance of the capacitor, the voltage error becomes small. This means that a cheaper chip capacitor can be adopted. For example, if the tolerance of the resistor is ±1%, the maximum value of the voltages applied across the respective ends of the capacitors C501 to C504 will be 457V. That is, a cheaper chip capacitor having a withstand voltage of 500V can be selected.

<Arrangement of Chip Capacitors and Chip Resistors>

Figure 4:
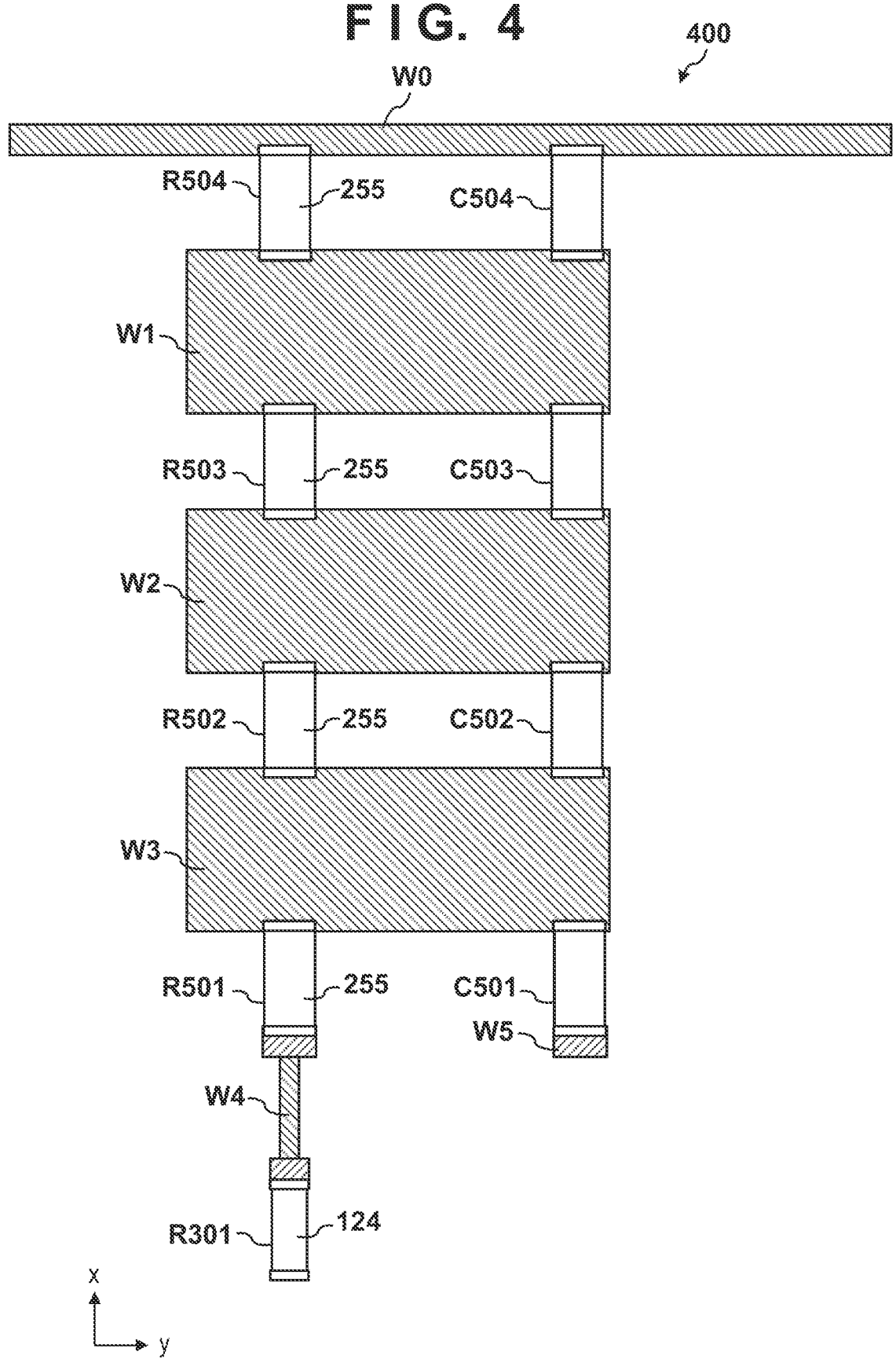
FIG. 4 is a diagram illustrating a comparative example of a wiring pattern of balance circuits.

FIG. 4 is a diagram illustrating an arrangement of the resistors R501 to R504 and the capacitors C501 to C504 on a printed circuit board 400 as a comparative example with respect to the present embodiment. The printed circuit board 400 is a printed circuit board forming the power supply substrate 200. For convenience of description, the x-axis direction and the y-axis direction are defined. In FIG. 4, the x-axis direction is parallel to the direction in which the resistors R501 to R504 are connected in series. The y-axis direction is parallel to the direction in which the copper foil pattern W0 extends (longitudinal direction).

Copper foil patterns (conductive patterns) W0 to W5 for electrically connecting electronic components are provided on the printed circuit board 400. The copper foil pattern W0 connects the anode of the diode D302 to the charging roller 2. Furthermore, one end of the resistor R504 and one end of the capacitor C504 are soldered to the copper foil pattern W0. The other end of the resistor R504, the other end of the capacitor C504, one end of the resistor R503, and one end of the capacitor C503 are soldered to the copper foil pattern W1. The other end of the resistor R503, the other end of the capacitor C503, one end of the resistor R502, and one end of the capacitor C502 are soldered to the copper foil pattern W2. The other end of the resistor R502, the other end of the capacitor C502, one end of the resistor R501, and one end of the capacitor C501 are soldered to the copper foil pattern W3. Furthermore, the other end of the resistor R501 and one end of the resistor R301 are soldered to the copper foil pattern W4. The copper foil pattern W5 is ground, and the other end of the capacitor C501 is soldered thereto.

The areas of the copper foil patterns W1, W2, and W3 are larger than the areas of the connection terminals of the chip components. The larger the areas of the copper foil patterns W1, W2, and W3, the smaller the respective thermal resistances. In particular, since high voltages are applied to the resistors R503 and R504, the amount of heat generated by the resistors R503 and R504 is large. Therefore, the copper foil pattern W1 having a large area is employed in order to improve the heat dissipation of the copper foil pattern W1. For example, when an experiment was performed with the environmental temperature at 25° C. and the high voltage VH at −1400V, the temperature of the resistors R503 and R504 was 43° C.

The capacitor C503 is connected in parallel to the resistor R503. The capacitor C504 is connected in parallel to the resistor R504. Heat generated in the resistors R503 and R504 is propagated to the capacitor C503 and C504 through the copper foil pattern W1, thereby increasing the temperature of the capacitors C503 and C504. In particular, since the thermal resistance of the copper foil pattern W1 is small, heat is easily transmitted. Therefore, the temperature of the capacitors C503 and C504 was 41° C.

Generally, a capacitor has a temperature characteristic. For example, the capacitance of a high dielectric constant multilayer ceramic capacitor may decrease by −10% to −20% in a high temperature region. When the reduction in capacitance gets large, the required capacitance intended for circuit design ceases to be obtainable. Therefore, the effect of reducing the density unevenness caused by C set is reduced. Here, the resistors R503 and R504, the capacitors C503 and C504, and the copper foil pattern W1 have been described. Since the current flowing through the resistors R501 and R502 is the same as the current flowing through the resistors R503 and R504, the above-described heat generation condition similarly occurs in the resistors R501 and R502, the capacitors C501 and C502, and the copper foil patterns W2 and W3.

Figure 5:
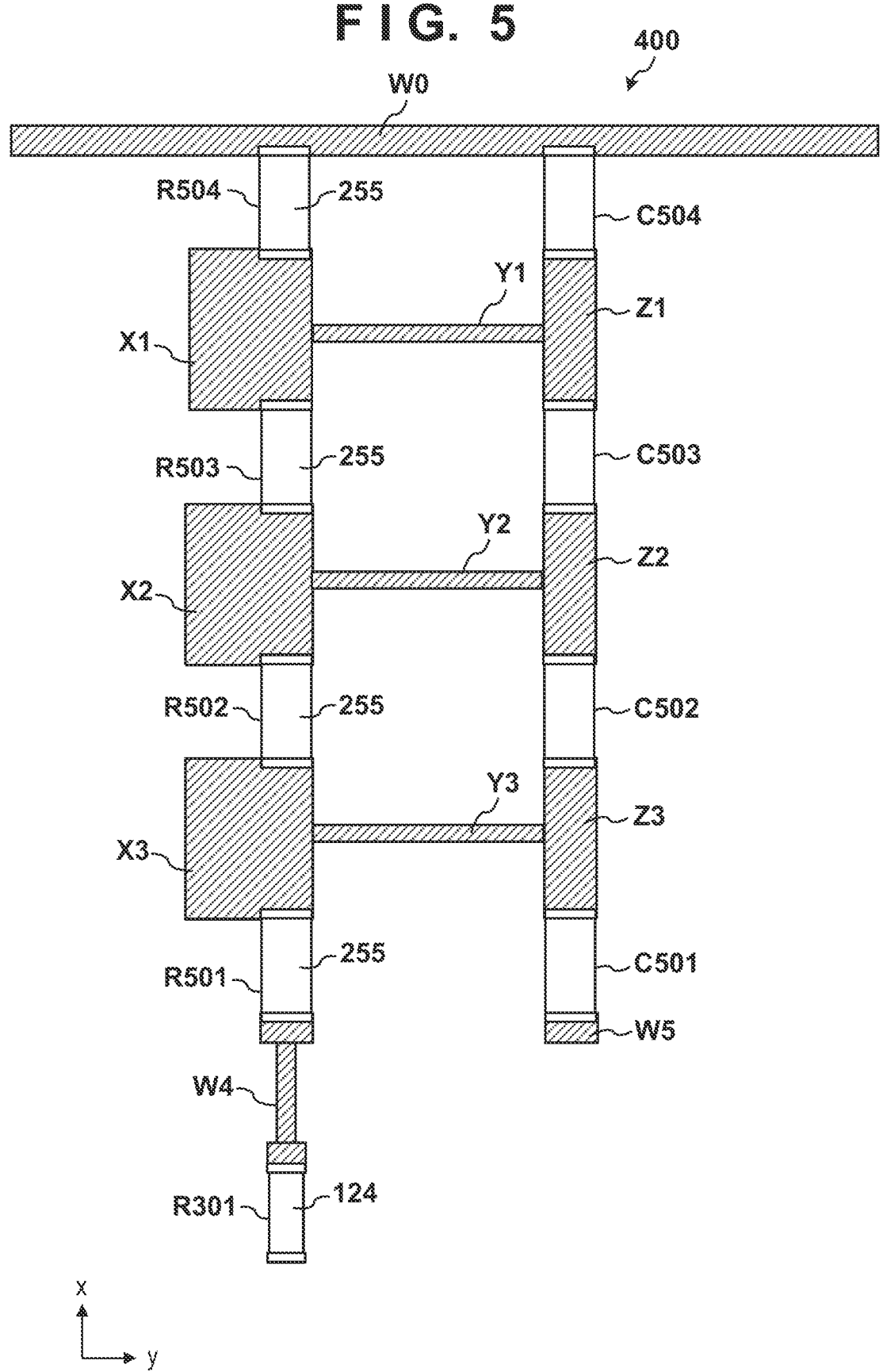
FIG. 5 is a diagram illustrating a wiring pattern of balance circuits.

FIG. 5 is a diagram illustrating an arrangement of the resistors R501 to R504 and the capacitors C501 to C504 on the printed circuit board 400 in the present embodiment. The copper foil patterns X1, X2, and X3 are patterns for connecting the resistors R502 to R504 in series. The other end of the resistor R504 and one end of the resistor R503 are connected to the copper foil pattern X1. The other end of the resistor R503 and one end of the resistor R502 are connected to the copper foil pattern X2. The other end of the resistor R502 and one end of the resistor R501 are connected to the copper foil pattern X1.

The copper foil patterns Z1, Z2, and Z3 are patterns for connecting the capacitors C502 to C504 in series. The other end of the capacitor C504 and one end of the capacitor C503 are connected to the copper foil pattern Z1. The other end of the capacitor C503 and one end of the capacitor C502 are connected to the copper foil pattern Z2. The other end of the capacitor C502 and one end of the capacitor C501 are connected to the copper foil pattern Z1.

The copper foil pattern Y1 is a copper foil pattern connecting the copper foil pattern X1 and the copper foil pattern Z1. The copper foil pattern Y2 is a copper foil pattern connecting the copper foil pattern X2 and the copper foil pattern Z2. The copper foil pattern Y3 is a copper foil pattern connecting the copper foil pattern X3 and the copper foil pattern Z3.

Since the areas of the copper foil patterns X1 to X3 are larger than the areas of the copper foil patterns Z1 to Z3, heat generated in the resistors R502 to R504 is easily dissipated. Since the heat generated by the resistors R502 to R504 is larger than the heat generated by the capacitors C502 to C504, a larger heat dissipation component (e.g., a heat sink) is required for the resistors R502 to R504.

Although the copper foil patterns Y1 to Y3 electrically connect the copper foil patterns X1 to X3 and the copper foil patterns Z1 to Z3, respectively, the thermal resistance of the copper foil patterns Y1 to Y3 is larger than the thermal resistance of the copper foil patterns X1 to X3. This is because the area of the copper foil patterns Y1 to Y3 is smaller than the area of the copper foil patterns X1 to X3, and the width (length) in the x-axis direction of the copper foil patterns Y1 to Y3 is narrower (shorter) than the width (length) in the x-axis direction of the copper foil patterns X1 to X3. In other words, the cross-sectional areas of the copper foil patterns Y1 to Y3 in the x-axis direction are smaller than the cross-sectional areas of the copper foil patterns X1 to X3 in the x-axis direction. As a result, heat is less likely to propagate from the copper foil patterns X1 to X3 to the copper foil patterns Z1 to Z3.

For example, for the arrangement illustrated by FIG. 5, when an experiment was performed with the environmental temperature at 25° C. and the high voltage VH at −1400V, the temperature of each of the resistors R503 and R504 was 45° C. The temperature of the capacitors C503 and C504 was 33° C. That is, compared to the arrangement illustrated in FIG. 4, the arrangement illustrated in FIG. 5 has the effect of reducing the temperature of the capacitors C503 and C504 by as much as 8° C. That is, the capacitance of the capacitors C503 and C504 is less likely to decrease.

Here, the resistors R503 and R504, the capacitors C503 and C504, and the copper foil patterns X1, Y1, and Z1 have been described. This applies similarly to the resistors R501 and R502, the capacitors C501 and C502, and the copper foil patterns X2, Y2, Z2, X3, Y3, and Z3.

Here, one capacitor is connected in parallel to one resistor, but a plurality of capacitors may be connected in parallel to one resistor. One capacitor may be connected in parallel to a plurality of resistors. Further, a plurality of resistors and a plurality of capacitors may be connected in parallel.

Although it is assumed that the resistances of the plurality of resistors connected in series are the same, they may be different from each other. Although it is assumed that the capacitances of the plurality of capacitors connected in series are the same, they may be different from each other.

The smaller the widths (line widths) of the copper foil patterns Y1 to Y3, the greater the effect of inhibiting thermal propagation to the capacitors C501 to C504. The lengths (widths) of the copper foil patterns Y1 to Y3 in the x-axis direction are shorter than the lengths of the copper foil patterns X1 to X3 in the x-axis direction and the lengths of the copper foil patterns Z1 to Z3 in the x-axis direction. The length of the copper foil patterns Y1 to Y3 in the x-axis direction may be the shortest length (minimum line width) that can be realized in manufacturing. That is, the copper foil patterns Y1 to Y3 may be the thinnest patterns on the printed circuit board 400.

Resistors having the same resistance are selected as the resistors R501 to R504, and capacitors having the same capacitance are selected as the capacitors C501 to C504, but this is merely an example. The resistors R501 to R504 are resistors for dividing the high voltage VH. In order to adjust the voltage division ratio, a plurality of resistors belonging to the E24 series may be combined. However, to configure the balance circuit, a resistor with an accuracy less than that of the capacitor should be selected. For example, if the tolerance of the capacitor is ±10%, a resistor with a tolerance of ±5% or ±1% is selected.

<Further Increase in Thermal Resistance>

As illustrated in FIG. 5, by increasing the thermal resistance between the resistors R501 to R504 and the capacitors C501 to C504, a change in capacitance of the capacitors C501 to C504 can be suppressed. In particular, in FIG. 5, the thermal resistance is increased by making the copper foil patterns Y1 to Y3 thinner.

Figure 6:
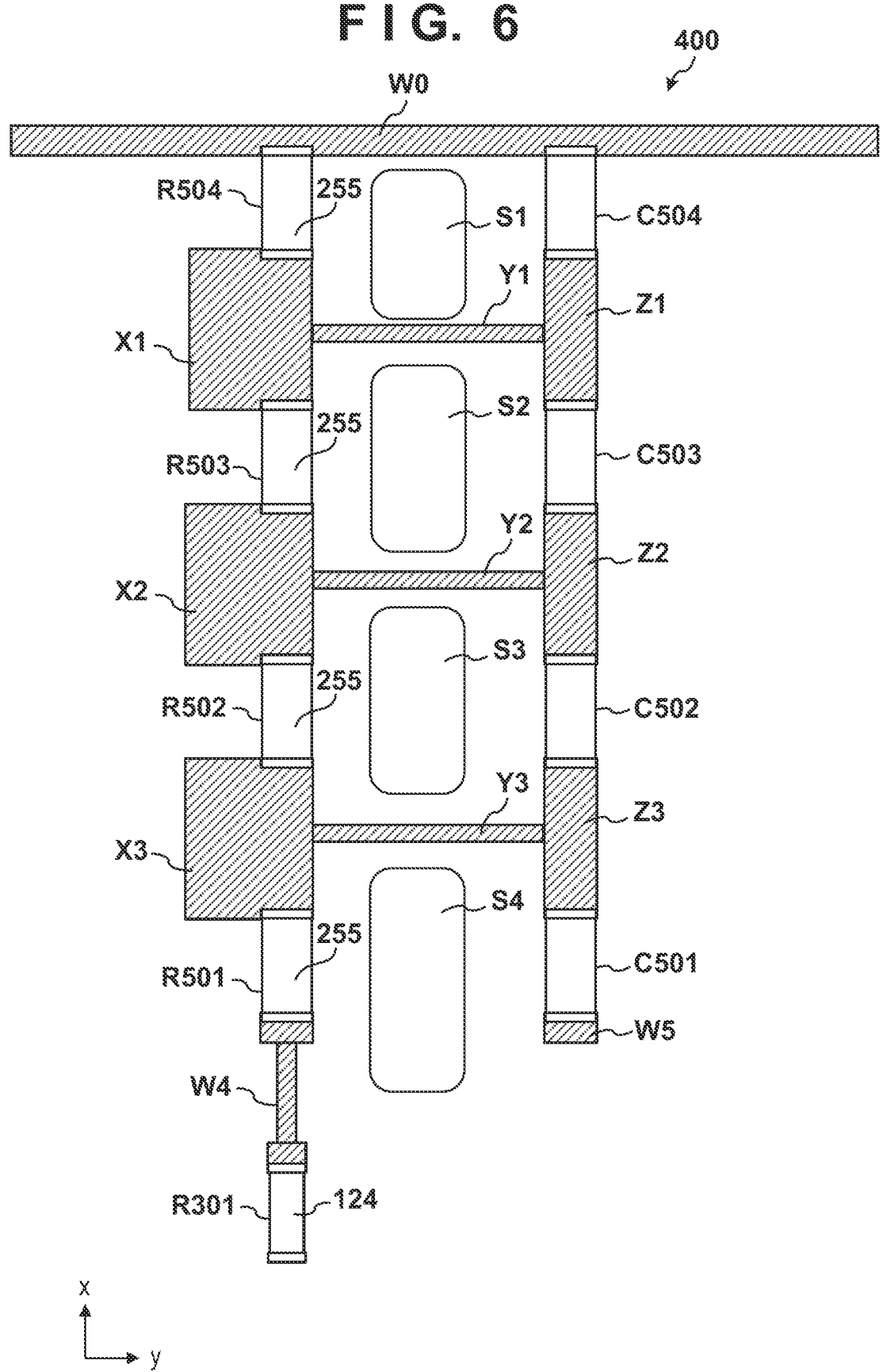
FIG. 6 is a diagram illustrating a wiring pattern of balance circuits.

FIG. 6 is a diagram illustrating an arrangement of the resistors R501 to R504 and the capacitors C501 to C504 on the printed circuit board 400 in a variation of FIG. 5. In comparison with FIG. 5, in FIG. 6, a plurality of slits S1 to S4 are provided on a printed circuit board 400.

The slit S1 is provided between the resistor R504 and the capacitor C504. The slit S2 is provided between the resistor R503 and the capacitor C503. The slit S3 is provided between the resistor R502 and the capacitor C502. The slit S4 is provided between the resistor R501 and the capacitor C501.

The slits S1 to S4 are grooves or through holes provided on the printed circuit board 400. Generally, paper phenol is used as a material of the printed circuit board 400. The thermal resistance of air is greater than that of paper phenol. Therefore, by employing the slits S1 to S4, thermal propagation to the capacitors C501 to C504 is further inhibited, and a change in capacitance of the capacitors C501 to C504 is suppressed.

The larger the areas and volumes of the slits S1 to S4 are, the more likely thermal propagation to the capacitors C501 to C504 will be hindered. That is, the change in capacitance of the capacitors C501 to C504 is suppressed more effectively.

The slit S1 is arranged as close as possible to the copper foil pattern W0 and the copper foil pattern Y1. The slit S2 is arranged as close as possible to the copper foil pattern Y1 and the copper foil pattern Y2. The slit S3 is arranged as close as possible to the copper foil pattern Y2 and the copper foil pattern Y3. The slit S4 is arranged as close as possible to the copper foil pattern Y3. Being "as close as possible" means as close as is feasible in the processing of the printed circuit board 400. The length (length in the x-axis direction) of each of the slits S1 to S4 is longer than the length (length in the x-axis direction) of each of the resistors R501 to R504. This is because thermal resistance increases as the area of the slits S1 to S4 increases.

SUMMARY

As illustrated in FIGS. 2 and 3, the high voltage generation circuit 203 is an example of a generation circuit that generates a voltage in accordance with a predetermined target voltage. The voltage detection circuit 205 is an example of a detection circuit that detects a voltage generated by the generation circuit and feeds back the voltage to the generation circuit. As illustrated in FIG. 5 and the like, the voltage detection circuit 205 includes a printed circuit board 400. The resistor R504 is an example of a first chip resistor mounted on a printed circuit board. The resistor R503 is an example of a second chip resistor mounted on the printed circuit board and connected in series with the first chip resistor. The copper foil pattern X1 is an example of a first pattern that is mounted on the printed circuit board and connects the first chip resistor and the second chip resistor in series. The capacitor C504 is an example of a first chip capacitor mounted on the printed circuit board and connected in parallel with the first chip resistor. The capacitor C503 is an example of a second chip capacitor that is mounted on the printed circuit board, is connected in parallel with a second chip resistor, and is connected in series with the first chip capacitor. The copper foil pattern Z1 is an example of a second pattern that is mounted on the printed circuit board and connects the first chip capacitor and the second chip capacitor in series. The copper foil pattern Y1 is an example of a third pattern for electrically connecting the first pattern and the second pattern. In particular, the thermal resistance of the third pattern is greater than the thermal resistance of the first pattern. This makes it difficult for a heat generated by a chip resistor to propagate to a chip capacitor. Therefore, a temperature rise of the chip capacitor is suppressed, and fluctuation of the capacitance of the chip capacitor is suppressed. Furthermore, density unevenness of a toner image caused by C set should also be reduced.

As illustrated in FIGS. 5 and 6, the first chip resistor and the second chip resistor may be arranged along a first direction (x-axis direction). As illustrated in FIGS. 5 and 6, the length of the third pattern in the first direction is shorter than the length of the first pattern in the first direction. As a result, the thermal resistance of the third pattern may be greater than the thermal resistance of the first pattern.

Further, the area of the third pattern may be smaller than the area of the first pattern. As a result, the thermal resistance of the third pattern may be greater than the thermal resistance of the first pattern. In addition, by making the area of the first pattern relatively large, heat generated by the first chip resistor and the second chip resistor in the first pattern can be efficiently dissipated.

Figure 7A:
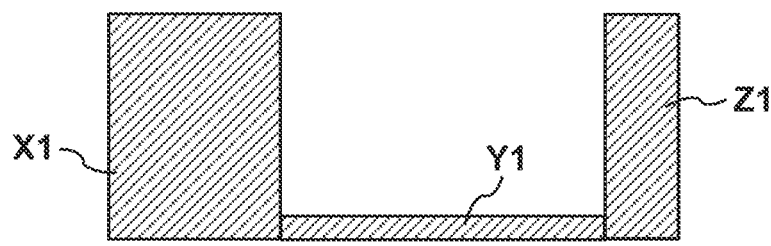
FIGS. 7A to 7C are diagrams illustrating wiring patterns of balance circuits.
Figure 7B:
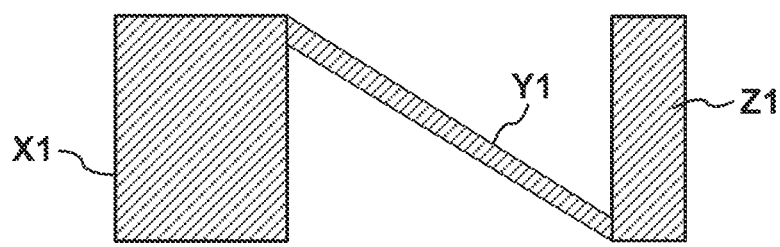
Figure 7C:
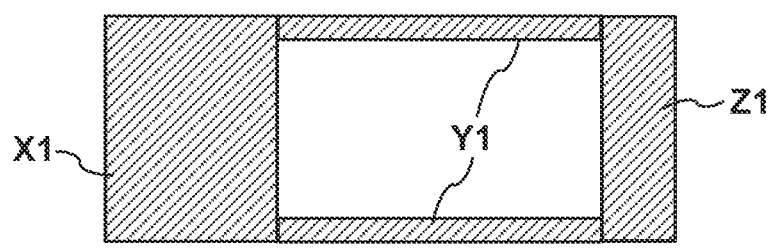

As illustrated in FIGS. 5 and 6, the first pattern, the second pattern, and the third pattern may form an H-shaped pattern. As illustrated in FIG. 7A, the copper foil pattern Y1, which is an example of the third pattern, may be provided in the vicinity of the end portions of the first pattern and the second pattern in the x-axis direction. As illustrated by FIG. 7B, the first pattern, the second pattern, and the third pattern may form an N-shaped pattern. As illustrated in FIG. 7C, a plurality of copper foil patterns Y1 may be provided. That is, the area of the copper foil pattern Y1 may be a shape smaller than the area of the copper foil pattern W1.

As illustrated in FIG. 5, the length of the first pattern in a second direction orthogonal to the first direction (y-axis direction) is longer than the length of the first chip resistor in the second direction. As a result, in the first pattern, it becomes easier for the heat of the first chip resistor to dissipate.

As illustrated in FIG. 6, the slits S1 to S3 are examples of first slits provided between the first chip resistor and the first chip capacitor in the printed circuit board. The first slit may be a through hole. The first slit may be a groove. The thermal resistance of the printed circuit board is smaller than the thermal resistance of air. That is, the thermal resistance of the air is larger than the thermal resistance of the material of the printed circuit board. Therefore, the slits S1 to S4 have an effect of increasing the thermal resistance between the chip capacitor and the chip resistor.

As illustrated in FIG. 6, the slits S2 to S4 are examples of second slits provided between the second chip resistor and the second chip capacitor in the printed circuit board. The second slit increases the thermal resistance between the chip capacitor and the chip resistor.

The line width of the third pattern may be the smallest line width among the line widths of the plurality of patterns provided on the printed circuit board. This would allow the thermal resistance of the third pattern to be the maximum thermal resistance achievable in manufacturing.

The first chip resistor and the second chip capacitor may form a balance circuit. This will suppress fluctuation in the output voltage. The tolerance of the first chip resistor is smaller than the tolerance of the first chip capacitor. As a result, fluctuation in the output voltage should be suppressed.

The resistor R502 is an example of a third chip resistor mounted on the printed circuit board and connected in series with the second chip resistor. The copper foil pattern X2 is an example of a fourth pattern that is mounted on the printed circuit board and connects the second chip resistor and the third chip resistor in series. The capacitor C502 is an example of a third chip capacitor that is mounted on the printed circuit board, is connected in parallel with a third chip resistor, and is connected in series with the second chip capacitor. The copper foil pattern Z2 is an example of a fifth pattern that is mounted on the printed circuit board and connects the second chip capacitor and the third chip capacitor in series. The copper foil pattern Y2 is an example of a sixth pattern for electrically connecting the fourth pattern and the fifth pattern. The thermal resistance of the sixth pattern is greater than the thermal resistance of the fourth pattern. This makes it difficult for a heat generated by a chip resistor to propagate to a chip capacitor.

The resistor R501 is an example of a fourth chip resistor that is mounted on the printed circuit board, is connected in series with the third chip resistor, and is connected in series with the third chip capacitor. The copper foil pattern X3 is an example of a seventh pattern that is mounted on the printed circuit board and connects the third chip resistor and the fourth chip resistor in series. The capacitor C501 is an example of a fourth chip capacitor mounted on a printed circuit board and connected in parallel with the fourth chip resistor. The copper foil pattern Z3 is an example of an eighth pattern that is mounted on the printed circuit board and connects the third chip capacitor and the fourth chip capacitor in series. The copper foil pattern Y3 is an example of a ninth pattern for electrically connecting the seventh pattern and the eighth pattern. The thermal resistance of the ninth pattern is greater than the thermal resistance of the seventh pattern. This makes it difficult for a heat generated by a chip resistor to propagate to a chip capacitor.

In the embodiment described above, an example in which the power supply substrate 200 supplies the charging voltage to the charging roller 2 has been described. However, the power supply substrate 200 may output a high voltage (developing voltage, transfer voltage) to be supplied to the developing device 4, the primary transfer roller 13, or the secondary transfer roller 14. That is, the present invention is applicable not only to a power supply apparatus for generating a charging voltage, but also to a power supply apparatus for generating at least one of a charging voltage, a developing voltage, and a transfer voltage.

The present invention is also applicable to a case where not a chip component but a lead component having a low withstand voltage is used.

The present invention is not limited to the embodiments described above, and various modifications and variations are possible without departing from the spirit and scope of the invention. Accordingly, the claims are appended hereto in order to make the scope of the invention public.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-051508, filed on Mar. 19, 2019 which is hereby incorporated by reference herein in its entirety.

What is claimed is:

1. A power supply apparatus comprising:
a generation circuit configured to generate, in accordance with a predetermined target voltage, a voltage to be supplied to a load; and
a detection circuit that is mounted on a printed circuit board and is configured to detect the voltage generated by the generation circuit and feed back the voltage to the generation circuit,
the detection circuit including:
a first resistor,
a second resistor connected in series with the first resistor,
a first conductive pattern configured to connect the first resistor and the second resistor in series,
a first capacitor connected in parallel to the first resistor,
a second capacitor connected in parallel to the second resistor and connected in series with the first capacitor,
a second conductive pattern configured to connect the first capacitor and the second capacitor in series, and
a third conductive pattern configured to electrically connect the first conductive pattern and the second conductive pattern,
wherein a thermal resistance of the third conductive pattern is greater than a thermal resistance of the first conductive pattern.

2. The power supply apparatus according to claim 1, wherein
in a case where a direction in which the first resistor and the second resistor are connected by the first conductive pattern is a first direction,
a length of the third conductive pattern in the first direction is shorter than a length of the first conductive pattern in the first direction.

3. The power supply apparatus according to claim 2, wherein
an area of the third conductive pattern is smaller than an area of the first conductive pattern.

4. The power supply apparatus according to claim 2, wherein
the first conductive pattern, the second conductive pattern, and the third conductive pattern form an H-shaped pattern.

5. The power supply apparatus according to claim 2, wherein
a length of the first conductive pattern in a second direction orthogonal to the first direction is longer than a length of the first resistor in the second direction.

6. The power supply apparatus according to claim 1, wherein
in the printed circuit board, a first slit is formed between the first resistor and the first capacitor.

7. The power supply apparatus according to claim 6, wherein
the first slit is a through hole.

8. The power supply apparatus according to claim 6, wherein
the first slit is a groove.

9. The power supply apparatus according to claim 6, wherein
a thermal resistance of the printed circuit board is smaller than a thermal resistance of air.

10. The power supply apparatus according to claim 1, wherein
in the printed circuit board, a second slit is formed between the second resistor and the second capacitor.

11. The power supply apparatus according to claim 1, wherein
the third conductive pattern has a line shape, and a line width of the third conductive pattern is a minimum line width among line widths of a plurality of conductive patterns provided on the printed circuit board.

12. The power supply apparatus according to claim 1, wherein
the first resistor and the second capacitor form a balance circuit.

13. The power supply apparatus according to claim 12, wherein
a tolerance of the first resistor is smaller than a tolerance of the first capacitor.

14. The power supply apparatus according to claim 1, wherein
the first conductive pattern, the second conductive pattern, and the third conductive pattern are copper foil patterns formed on the printed circuit board.

15. The power supply apparatus according to claim 1, wherein
the detection circuit further includes:
a third resistor connected in series with the second resistor,
a fourth conductive pattern configured to connect the second resistor and the third resistor in series,
a third capacitor connected in parallel to the third resistor and connected in series with the second capacitor,
a fifth conductive pattern configured to connect the second capacitor and the third capacitor in series, and a sixth conductive pattern configured to electrically connect the fourth conductive pattern and the fifth conductive pattern,
wherein a thermal resistance of the sixth conductive pattern is greater than a thermal resistance of the fourth conductive pattern.

16. The power supply apparatus according to claim 15, wherein
the detection circuit further includes:
a fourth resistor connected in series with the third resistor,
a seventh conductive pattern configured to connect the third resistor and the fourth resistor in series,
a fourth capacitor connected in parallel to the fourth resistor and connected in series with the third capacitor,
an eighth conductive pattern configured to connect the third capacitor and the fourth capacitor in series, and
a ninth conductive pattern configured to electrically connect the seventh conductive pattern and the eighth conductive pattern,
wherein a thermal resistance of the ninth conductive pattern is greater than a thermal resistance of the seventh conductive pattern.

17. An image forming apparatus comprising:
an image forming unit configured to form an image on a printing medium by an electrophotographic process;
a generation circuit configured to, in accordance with a predetermined target voltage, generate a high voltage to be supplied to a predetermined load included in the image forming unit; and
a detection circuit that is mounted on a printed circuit board and is configured to detect the high voltage generated by the generation circuit and feed back the high voltage to the generation circuit,
the detection circuit including:
a first resistor,
a second resistor connected in series with the first resistor,
a first conductive pattern configured to connect the first resistor and the second resistor in series,
a first capacitor connected in parallel to the first resistor,
a second capacitor connected in parallel to the second resistor and connected in series with the first capacitor,
a second conductive pattern configured to connect the first capacitor and the second capacitor in series, and
a third conductive pattern configured to electrically connect the first conductive pattern and the second conductive pattern,
wherein a thermal resistance of the third conductive pattern is greater than a thermal resistance of the first conductive pattern.

18. An image forming apparatus comprising:
a charging unit configured to charge a photosensitive member;
an exposure unit configured to expose the photosensitive member to form an electrostatic latent image;
a developing unit configured to develop the electrostatic latent image to form a toner image;
a transfer unit configured to transfer the toner image to a sheet; and
a power supply apparatus for generating at least one of a charging voltage to be supplied to the charging unit, a developing voltage to be supplied to the developing unit, and a transfer voltage to be supplied to the transfer unit,
wherein the power supply apparatus comprises:
a generation circuit configured to generate at least one of the charging voltage, the developing voltage, and the transfer voltage,
a detection circuit that is mounted on a printed circuit board and is configured to detect the voltage generated by the generation circuit and feed back the voltage to the generation circuit,
the detection circuit including:
a first resistor,
a second resistor connected in series with the first resistor,
a first conductive pattern configured to connect the first resistor and the second resistor in series,
a first capacitor connected in parallel to the first resistor,
a second capacitor connected in parallel to the second resistor and connected in series with the first capacitor,
a second conductive pattern configured to connect the first capacitor and the second capacitor in series, and
a third conductive pattern configured to electrically connect the first conductive pattern and the second conductive pattern,
wherein a thermal resistance of the third conductive pattern is greater than a thermal resistance of the first conductive pattern.

* * * * *